United States Patent
Yoshihara et al.

(10) Patent No.: US 11,239,051 B2
(45) Date of Patent: Feb. 1, 2022

(54) CHARGED PARTICLE BEAM DEVICE

(71) Applicant: Hitachi High-Technologies Corporation, Tokyo (JP)

(72) Inventors: Mai Yoshihara, Tokyo (JP); Yuusuke Oominami, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/481,918

(22) PCT Filed: Feb. 13, 2017

(86) PCT No.: PCT/JP2017/005032
§ 371 (c)(1),
(2) Date: Jul. 30, 2019

(87) PCT Pub. No.: WO2018/146804
PCT Pub. Date: Aug. 16, 2018

(65) Prior Publication Data
US 2019/0378687 A1    Dec. 12, 2019

(51) Int. Cl.
*H01J 37/22* (2006.01)
*H01J 37/28* (2006.01)
(Continued)

(52) U.S. Cl.
CPC ........... *H01J 37/28* (2013.01); *H01J 37/20* (2013.01); *H01J 37/226* (2013.01); *H01J 37/265* (2013.01); *H01J 37/10* (2013.01)

(58) Field of Classification Search
CPC .. H01J 37/28; H01J 37/20; H01J 37/22; H01J 37/226; H01J 2237/20228; H01J 2237/202; H01J 37/10; H01J 37/265
See application file for complete search history.

(56) References Cited

U.S. PATENT DOCUMENTS 2,421,722 A * 6/1947 Smith ............... H01J 37/18
                                                      250/442.11
4,020,353 A * 4/1977 Saito ................ H01J 37/18
                                                      250/441.11
(Continued)

FOREIGN PATENT DOCUMENTS

JP         60-218845 A      11/1985
JP         61-24136 A        2/1986
(Continued)

OTHER PUBLICATIONS

Japanese-language Office Action issued in Japanese Application No. 2018-566726 dated Jun. 2, 2020 with English translation (eight (8) pages).

(Continued)

*Primary Examiner* — Wyatt A Stoffa
(74) *Attorney, Agent, or Firm* — Crowell & Moring LLP (57) ABSTRACT

An object of the invention is to provide a device for observing the same field of view with a charged particle beam device and a camera without increasing a size of a housing. A charged particle beam device according to an aspect of the invention includes: a lens barrel that irradiates a sample with a charged particle beam; an imaging unit that images an optical image of the sample; a sample table on which the sample is placed; and a stage that is movable and on which the sample table is placed, wherein when a distance between a physical central axis of the sample table and a physical optical axis of the imaging unit is defined as a first distance, and a distance between a virtual central axis of the sample table and a physical central axis of the imaging unit, or between the physical central axis of the sample table and a virtual central axis of the imaging unit, or between the virtual central axis of the sample table and the virtual central
(Continued)

axis of the imaging unit is defined as a second distance, the second distance is shorter than the first distance.

7 Claims, 7 Drawing Sheets

(51) Int. Cl.
*H01J 37/20* (2006.01)
*H01J 37/26* (2006.01)
*H01J 37/10* (2006.01)

(56) References Cited

U.S. PATENT DOCUMENTS

| | | | | |
|---|---|---|---|---|
| 4,683,378 | A | 7/1987 | Shimase et al. | |
| 5,055,696 | A * | 10/1991 | Haraichi | H01J 37/228 250/492.2 |
| 5,216,235 | A * | 6/1993 | Lin | G01B 11/026 250/201.6 |
| 5,734,164 | A * | 3/1998 | Sanford | H01J 37/28 250/310 |
| 5,747,816 | A * | 5/1998 | Kurosaki | H01J 37/3174 250/491.1 |
| 5,905,266 | A * | 5/1999 | Larduinat | H01J 37/226 250/492.21 |
| 6,118,123 | A * | 9/2000 | Notoya | H01J 37/256 250/307 |
| 6,407,373 | B1 * | 6/2002 | Dotan | H01J 37/21 250/201.3 |
| 6,621,082 | B2 * | 9/2003 | Morita | H01J 37/21 250/201.3 |
| 6,855,940 | B2 * | 2/2005 | Mutou | H01J 37/20 250/440.11 |
| 7,599,076 | B2 * | 10/2009 | Saito | G01B 11/0608 356/630 |
| 7,851,753 | B2 * | 12/2010 | Uto | G01N 21/95607 250/310 |
| 8,487,252 | B2 * | 7/2013 | Diemer | H01J 37/222 250/311 |
| 9,673,023 | B2 * | 6/2017 | Goldenshtein | H01J 37/28 |
| 9,816,946 | B2 * | 11/2017 | Stegmann | G01N 23/04 |
| 2005/0122508 | A1 * | 6/2005 | Uto | H01J 37/226 356/237.2 |
| 2007/0057184 | A1 * | 3/2007 | Uto | H01J 37/226 250/310 |
| 2009/0218509 | A1 * | 9/2009 | Ito | H01J 37/20 250/442.11 |
| 2009/0309022 | A1 * | 12/2009 | Gunji | G01N 23/2251 250/307 |
| 2010/0019148 | A1 * | 1/2010 | Nara | H01J 37/28 250/307 |
| 2010/0181480 | A1 * | 7/2010 | Shimakura | H01J 37/026 250/310 |
| 2011/0248164 | A1 * | 10/2011 | Straw | H01J 37/28 250/307 |
| 2012/0001070 | A1 | 1/2012 | Takagi | |
| 2012/0074319 | A1 * | 3/2012 | Nishiyama | H01J 37/226 250/307 |
| 2012/0112062 | A1 * | 5/2012 | Novak | H01J 37/244 250/307 |
| 2012/0112063 | A1 * | 5/2012 | Schertel | H01J 37/28 250/307 |
| 2012/0326033 | A1 | 12/2012 | Shiono et al. | |
| 2013/0140459 | A1 * | 6/2013 | Galloway | H01J 37/28 250/310 |
| 2013/0284924 | A1 | 10/2013 | Mizuochi et al. | |
| 2014/0014848 | A1 * | 1/2014 | Hatakeyama | G01N 23/223 250/393 |
| 2016/0211112 | A1 * | 7/2016 | Nakao | H01J 37/226 |
| 2018/0108512 | A1 * | 4/2018 | Ishizawa | H01J 37/20 |

FOREIGN PATENT DOCUMENTS

| | | |
|---|---|---|
| JP | 61-96644 A | 5/1986 |
| JP | 8-153483 A | 6/1996 |
| JP | 9-22676 A | 1/1997 |
| JP | 9-35677 A | 2/1997 |
| JP | 10-3875 A | 1/1998 |
| JP | 10-199467 A | 7/1998 |
| JP | 11-274044 A | 10/1999 |
| JP | 2011-187192 A | 9/2011 |
| JP | 2012-15029 A | 1/2012 |
| JP | 2012-146581 A | 8/2012 |
| WO | WO-0225691 A1 * 3/2002 | ............ G01N 23/04 |

OTHER PUBLICATIONS

International Search Report (PCT/ISA/210) issued in PCT Application No. PCT/JP2017/005032 dated Jun. 6, 2017 with English translation (four (4) pages).

Japanese-language Written Opinion (PCT/ISA/237) issued in PCT Application No. PCT/JP2017/005032 dated Jun. 6, 2017 (five (5) pages).

* cited by examiner

000
CHARGED PARTICLE BEAM DEVICE

TECHNICAL FIELD

The present invention relates to a charged particle beam device.

BACKGROUND ART

An electron microscope, such as a scanning electron microscope (SEM) and a transmission electron microscope (TEM), has been used in a wide range of fields for observing microstructures of an object. The electron microscope can acquire high magnification information and high resolution information, but cannot acquire color information and low magnification information. On the other hand, an optical imaging camera (hereinafter, referred to as cameras) and an optical microscope can acquire color information and low magnification information, but cannot acquire high magnification information and high resolution information. Here, there is disclosed a technique in which a sample is photographed by a camera installed outside an SEM device and a photographing position thereof is controlled before SEM observation (PTL 1). Further, a device that includes an optical observation device in a vacuum housing and that is provided with an SEM is disclosed (PTL 2).

PRIOR ART LITERATURE

Patent Literature

PTL 1: JP-A-H10-003875
PTL 2: JP-A-S60-218845

SUMMARY OF INVENTION

Technical Problem

According to the above-mentioned related art, the size of the vacuum housing is increased due to the necessity of transferring the sample from an optical axis of the SEM to an optical axis of the camera. This is because it is difficult to bring the camera close to an objective lens of the SEM in consideration of the focal length of the camera, and it may be difficult to introduce the camera in vacuum. On the other hand, in a small-sized desktop SEM or the like, the size of the device is limited for disposing the device on a desk, and the size of the vacuum housing cannot be increased. Therefore, there is a problem that only an end of the sample can be observed in the camera when the camera is mounted in a small-sized vacuum housing.

Therefore, an object of the invention is to provide a device for observing the same field of view with a charged particle beam device and a camera without increasing a size of a housing.

Solution to Problem

A charged particle beam device according to an aspect of the invention includes: a lens barrel that irradiates a sample with a charged particle beam; an imaging unit that images an optical image of the sample; a sample table on which the sample is placed; and a stage that is movable and on which the sample table is placed, wherein when a distance between a physical central axis of the sample table and a physical optical axis of the imaging unit is defined as a first distance, and a distance between a virtual central axis of the sample table and a physical central axis of the imaging unit, or between the physical central axis of the sample table and a virtual central axis of the imaging unit, or between the virtual central axis of the sample table and the virtual central axis of the imaging unit is defined as a second distance, the second distance is shorter than the first distance.

Advantageous Effect

According to the invention, it is possible to provide a device for observing the same field of view with a charged particle beam device and a camera without increasing a size of a housing.

DESCRIPTION OF EMBODIMENTS

In the following embodiments, an SEM is used as an example of a charged particle beam device, but it is needless to say that the invention can also be applied to a TEM, a scanning transmission electron microscope (STEM), a scanning ion microscope, a scanning probe microscope, an optical microscope, a laser microscope, and the like.

Figure 1:
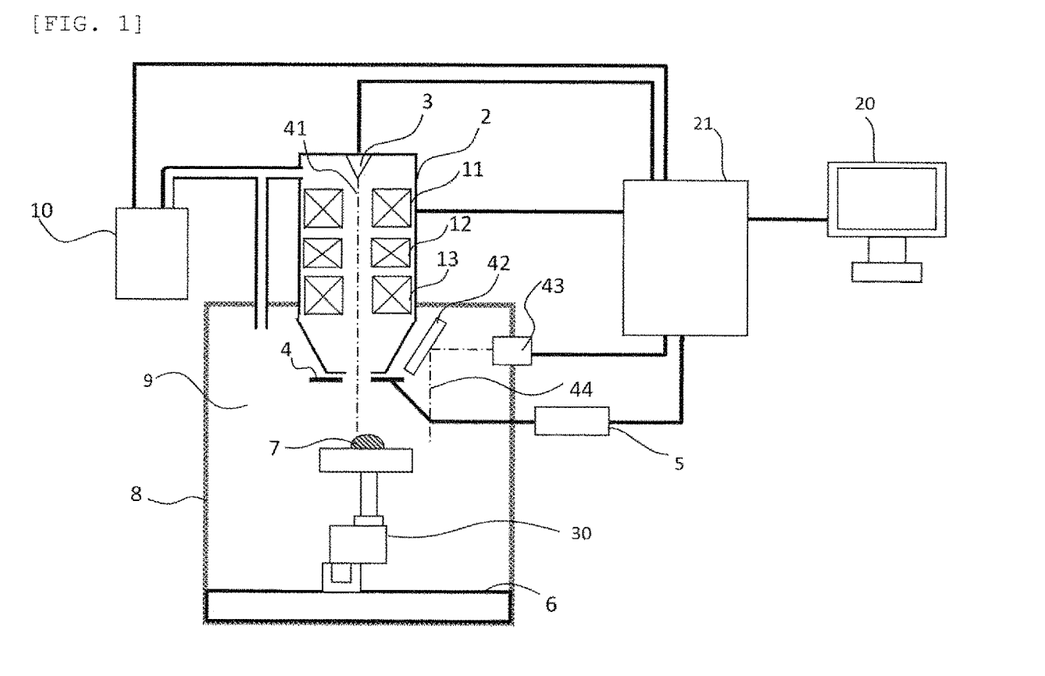
FIG. 1 is a diagram showing an overall configuration of an SEM.

FIG. 1 is a diagram showing an overall configuration of the SEM. The SEM is a device that irradiates a sample 7 disposed in a vacuum or substantially vacuum space 9 with a charged particle beam (electron beam here) from a charged particle beam source 3 (electron source here) for observation, and mainly includes a charged particle optical lens barrel 2 (hereinafter referred to as a lens barrel), a housing 8 that supports and is connected with the lens barrel 2, a stage 6, a mirror 42, a camera (imaging unit) 43, and a control unit 21 that controls various constituent elements. The inside of both the lens barrel 2 and the housing 8 are evacuated by a pump 10.

The stage 6 includes an XY drive mechanism that drives the sample 7 in a left-right direction with respect to an SEM ground contact surface, a Z drive mechanism that drives the sample 7 in a height direction, an R drive mechanism that drives the sample 7 in a rotation direction, and the like. A target observation portion in the sample 7 can be moved to a center of a field of view by these drive mechanisms. An axis shifting sample table 30 to be described below on which the sample 7 is placed is disposed on the stage 6.

The lens barrel 2 includes the electron source 3, a condenser lens 11 that narrows an electron beam, a deflection coil 12 for scanning the sample 7 with the electron beam, and an objective lens 13 that focuses a focal point of the electron beam on a surface of the sample 7. A detector 4 that detects secondary charged particles (secondary electrons or reflected electrons) obtained by irradiation with the electron beam is disposed at a lower end portion of the lens barrel 2, and an image of the sample 7 is generated based on a signal obtained by the detector 4.

The camera 43 is disposed at a position shifted from a central axis of the objective lens 13 and on a lower side of the objective lens 13.

The control unit 21 controls the pump 10, the electron source 3, the condenser lens 11, the deflection coil 12, the objective lens 13, and other components. The control unit 21 receives an output signal of the detector 4 via an amplifier 5 such as a preamplifier, converts the signal into a digital image signal, and displays an image on a display unit 20. The display unit 20 is connected to the control unit 21 and includes a monitor on which an operation screen (GUI) of the SEM is displayed and an input unit (such as a keyboard or a mouse) to the operation screen.

The control unit 21 may be configured as hardware by a dedicated circuit board, or may be configured to realize each function by executing software stored in a storage device by a general-purpose CPU. The control unit 21 may be divided into a high order control unit that communicates with the display unit 20, and a low order control unit that controls an evacuation system, a charged particle optical system, and the like.

The configuration of the SEM is not limited to that in FIG. 1, and for example, the detector 4 may be inside the lens barrel 2, or a lens, an electrode, a detector and the like, other than the elements shown in FIG. 1, may be provided. Further, modifications of the control unit, the pump, communication wires and the like are not particularly limited as long as the functions intended in the present embodiment are realized. The amplifier 5 may not be necessary. Further, the detector 4 may be provided directly below or in the vicinity of the sample in the case of a transmission detector capable of detecting a transmission signal.

Programs and other information that realize each of the above-mentioned functions can be stored in a storage device such as a memory, a hard disk and a solid state drive (SSD), or a recording medium such as an IC card, an SD card, and an optical disk.

Figure 2A:
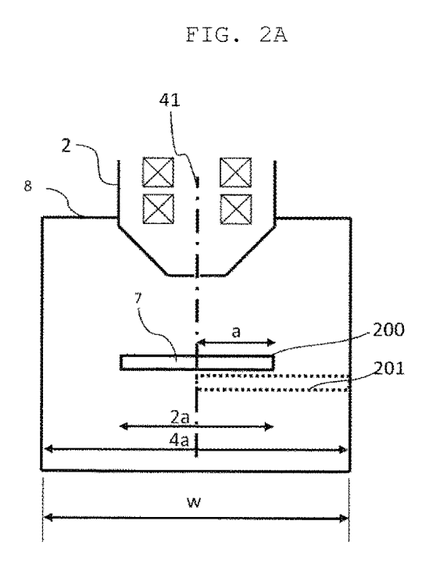
FIGS. 2A and 2B show diagrams different in the presence and absence of a camera in the SEM.
Figure 2B:
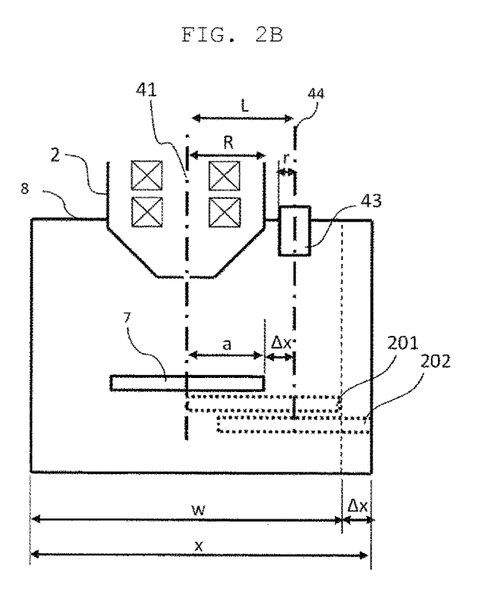

Next, the present embodiment will be described in detail. FIG. 2 shows diagrams different in the presence and absence of a camera in the SEM, in which FIG. 2A shows a state where the camera 43 is not provided and FIG. 2B shows a state where the camera 43 is provided.

First, it is considered that the camera 43 is disposed as close to the lens barrel as possible from the viewpoint of reducing the size of the device. When a distance between an optical axis 41 of the SEM and an optical axis 44 of the camera 43 is taken as L, a radius of the lens barrel 2 is taken as R, and a radius of the camera 43 is taken as r, a relationship among L, R, and r is expressed by the following formula (1).

$$L \geq R + r \qquad (1)$$

Next, a sample position in a case where a center of the sample 7 is on the optical axis 41 of the SEM is taken as a position 200, and a position where an end of the sample is observable, or a position where the end of the sample is observable or a position where the end of the sample is closest to an side surface of the housing 8 is taken as a position 201. When a size of the housing 8 in a state where the camera 43 is not provided in the SEM is taken as w, a size of the housing 8 in a state where the camera 43 is mounted is taken as x, and an increment of the housing 8 when the sample 7 is disposed to a position 202 when the center of the sample 7 is disposed on the optical axis 44 of the camera is taken as Δx, a relationship among x, w, and Δx is expressed by the following formula (2).

$$x = w + \Delta x \qquad (2)$$

In the present embodiment, a method for reducing Δx is provided. When considering that the center of the sample 7 to be observed with the SEM is observed with the camera 43, since Δx is equal to an increment of a moving distance a of the stage, a relationship among Δx, L, and a is expressed by the following formula (3).

$$\Delta x = L - a \qquad (3)$$

That is, in order to reduce Δx, L may be reduced or a may be increased. However, in order to be capable of observing the entire sample with the SEM, it is necessary that twice the length of the moving distance a of the stage is the size of the housing 8 (diameter is 2a). Therefore, a condition of the size w of the housing 8 is expressed by the following formula (4).

$$W \geq 4a \qquad (4)$$

That is, when a is increased, w is also increased. However, in the present embodiment, the object is not to increase the size of the housing 8. Therefore, in order to achieve the object of providing a device for observing the same field of view with the SEM and the camera without increasing the size of the housing 8, only L is reduced. Hereinafter, a method of reducing Δx by reducing L will be described.

Figure 3A:
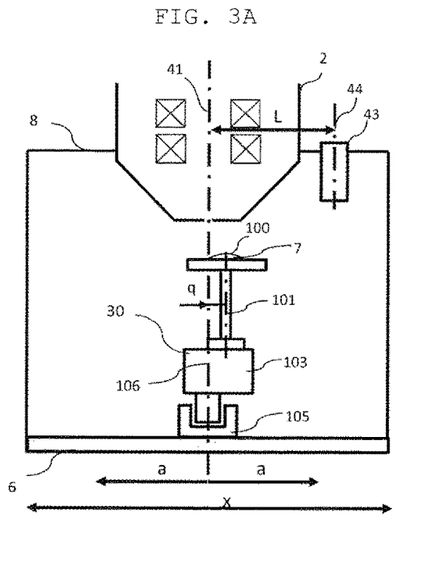
FIGS. 3A and 3B show an SEM that uses an axis shifting sample table.
Figure 3B:
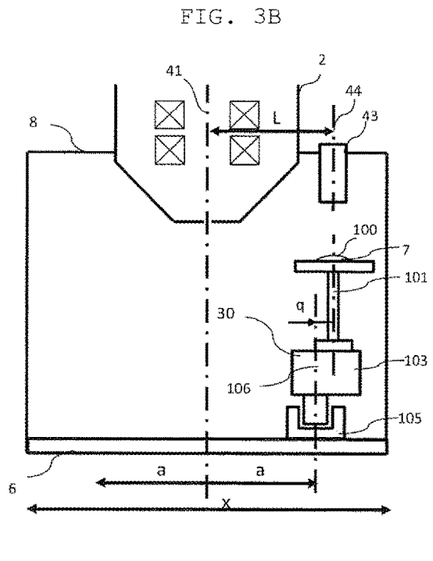

FIG. 3 shows an SEM that uses an axis shifting sample table. FIG. 3A shows a case where a sample base portion 105 of the axis shifting sample table 30 is at a central position of the stage 6 that can be driven by a distance a on both sides, and FIG. 3B shows a case where the sample base portion 105 is moved from the central position of the stage 6 to a side surface side of the housing 8 by the distance a. The axis shifting sample table 30 includes an axis shifting portion 103 that shifts a central axis 101 of the observation portion in the sample 7 from a central axis 106 of the sample base portion 105 by a distance q.

Here, the central axis 106 of the sample table when the axis shifting is not performed is referred to as a "physical central axis of the sample table", the central axis 101 shifted by the distance q with axis shifting portion 103 is referred to as a "virtual central axis of the sample table", and the optical axis 44 of the camera 43 is referred to as a "physical optical axis of the imaging unit". When a distance between the physical central axis 106 of the sample table and the physical optical axis 44 of the imaging unit is defined as a first distance (L), and a distance between the virtual central axis 101 of the sample table and the physical central axis 44 of the imaging unit is defined as a second distance (L−q), the second distance is shorter than the first distance (L>L−q). In addition, a relationship among the increment Δx of the size of the housing 8 necessary for observing the sample with the camera 43, L, q, and a is expressed by the following formula (5).

$$\Delta x = (L - q) - a \qquad (5)$$

That is, when compared with formula (3), L is substituted with L−q, and Δx is reduced. As shown by the comparison between FIG. 3A and FIG. 3B, when there is the distance q corresponding to the axis shifting, the observation portion in the sample can be observed with the camera 43 even when the moving distance a of the stage is shorter than the distance L. Particularly, when $$\Delta x = (L - q) - a = 0 \qquad (5)'$$

the size of the housing 8 is not increased even when the camera 43 is introduced into the housing 8.

Figure 4A:
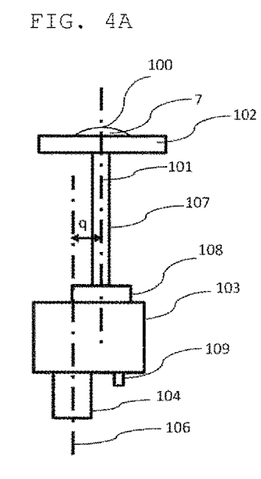
FIGS. 4A to 4C show configurations of the axis shifting sample table.

FIG. 4 shows configurations of the axis shifting sample table. The axis shifting sample table 30 of FIG. 4A includes a disposition table 102 on which the sample 7 is placed, an adjustment screw 107, a nut 108, the axis shifting portion 103, and a base 104. The axis shifting sample table 30 has the central axis 101 of the disposition table 102 and the central axis 106 of the base 104, and a distance between the two axes is q. The base 104 is connected to the axis shifting portion 103. The central axis of the base 104 is the central axis 106, and the base 104 can be disposed above the sample base portion 105. The sample base portion 105 is placed on the stage 6, and the sample base portion 105 is moved by moving the stage 6. The disposition table 102 is connected to the axis shifting portion 103 via the adjustment screw 107. An observation portion 100 is disposed at a center of the disposition table 102.

The axis shifting portion 103 has a female screw on the central axis 101 of the observation portion, the adjustment screw 107 has a diameter corresponding to the female screw, and a height of the disposition table 102 can be changed according to a height of the sample 7. When a longitudinal force is applied to the central axis 101, the adjustment screw 107 moves up and down, so that the adjustment screw 107 is fixed using the nut 108. The nut 108 has a female screw corresponding to the adjustment screw 107 at the center, and can fix the adjustment screw 107 at a height by grounding the nut 108 with the axis shifting portion 103.

Here, in order to keep the axis 101 and the axis 106 parallel to each other, the axis shifting portion 103 includes a rotation preventing pin 109. The rotation preventing pin 109 fixes the axis shifting sample table 30 at an angle. When a mechanism that can fix the axis shifting sample table 30 so as not to allow the rotation thereof is provided on the stage 6 or the axis shifting sample table 30, the rotation preventing pin 109 may not be provided.

Figure 4B:
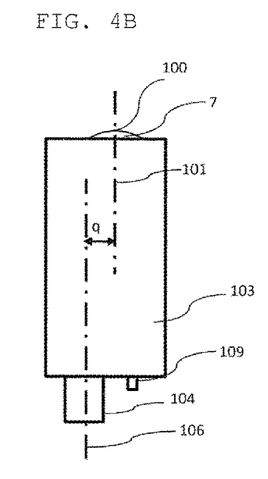

FIG. 4B shows a configuration in which the sample 7 is directly disposed on the axis shifting portion 103. Here, since height adjustment of the adjustment screw may not be performed when the height of a plurality of observation samples is constant, increase in vibration that is feared can be decreased by using the adjustment screw.

Figure 4C:
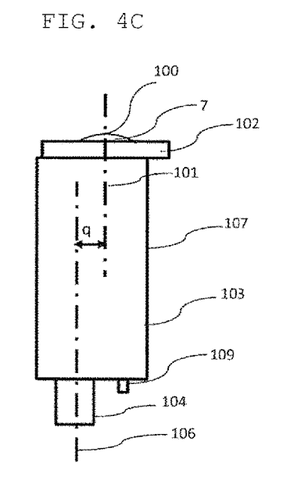

FIG. 4C shows a configuration in which the disposition table 102 is directly placed on the axis shifting portion 103. When used as a normal sample table, it is disposed so that the central axis 106 of the base 104 coincides with the central axis 101 of the observation portion. When used as the axis shifting sample table 30, the central axis 101 of the observation portion is slid by a distance q, and the disposition table 102 is disposed.

The configuration of the axis shifting sample table 30 is not limited to FIG. 4, as long as the central axis 101 of the observation portion and the central axis 106 of the base 104 are shifted by a distance q. The shape of the disposition table 102 and the axis shifting portion 103 may be any shape, for example, a circular shape (elliptical shape) or a quadrangle shape (rectangular shape, rhombic shape).

Figure 5A:
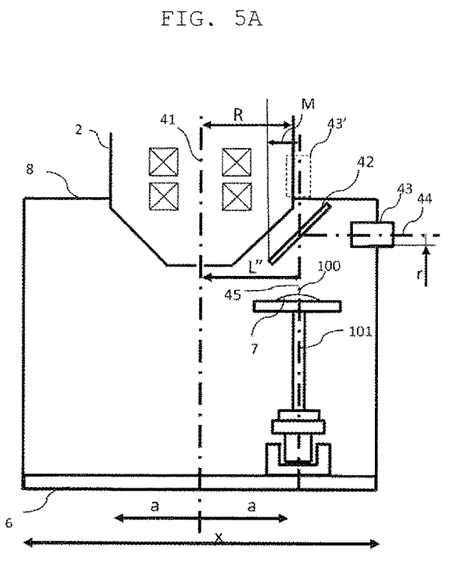
FIGS. 5A and 5B show an SEM that uses a mirror.
Figure 5B:
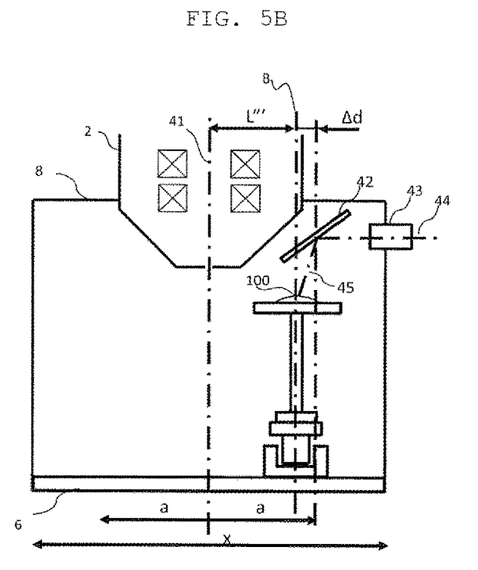

Next, a method of reducing Δx by using a mirror will be described. FIG. 5 shows an SEM that uses a mirror. Here, the mirror 42 is disposed in the vicinity of the lens barrel 2 at a predetermined angle with respect to the central axis 101. The camera 43 is disposed on the side surface of the housing 8 and includes an imaging lens with respect to the mirror 42. Since light emitted from the camera 43 along the optical axis 44 is refracted at an angle same as an angle of light incident on the mirror 42, the optical axis 45 of the light reflected by the mirror 42 apparently becomes the central axis 44 of the camera. That is, the camera 43, which cannot be physically disposed, is virtually disposed in contact with the lens barrel 2 by the mirror 42 (a virtual camera 43').

When the optical axis 45 of the camera, which is reflected by the mirror 42, and the central axis 101 of the observation portion are disposed to be coaxial, the observation portion 100 can be observed with the camera 43 via the mirror 42. When a distance from the optical axis 41 of the SEM to the optical axis 45 of the camera, which is reflected by the mirror 42, is taken as L", a relationship among Δx, L", and a is expressed by the following formula (6).

$$\Delta x = L'' - a \tag{6}$$

Further, the following formula (7) holds true.

$$L \geq R + r \geq L'' \tag{7}$$

The mirror 42 is disposed in accordance with the shape and the angle of a lower portion of the lens barrel 2, but R>L" may be set depending on the disposition. That is, since the mirror 42 can be disposed closer to the lens barrel 2 than the camera 43, $$L > L'' \tag{8}$$

is obtained. That is, when the optical axis 45 of the virtual camera 43' is referred to as the "virtual optical axis of the imaging unit" and the distance between the physical central axis of the sample table and the virtual central axis of the imaging unit is defined as a second distance (L"), the second distance is shorter than the first distance (L>L").

What is important in the present configuration is that a portion of the lens barrel 2 and a portion of the mirror 42 overlap with each other (portion M in the drawing) when viewed from the direction of the electron source 3.

In FIG. 5A, the mirror 42 is disposed such that the angle between the sample 7 or the sample ground contact surface (sample table surface) and the mirror surface is 45 degrees. Since the optical axis 44 of the camera and the optical axis 45 of the light reflected by the mirror 42 are perpendicular to each other, the sample 7 is viewed as viewed from right above. On the other hand, as shown in FIG. 5B, the optical axis 45 of the camera reflected by the mirror 42 that observes the sample 7 is tilted as shown in the drawing when the mirror 42 is set to an angle less than 45 degrees with respect to the sample. As a result, the observation portion 100 can be moved to an optical axis side of the lens barrel 2. Here, an axis, which is parallel to the optical axis 41 of the SEM and passes through an intersection of the optical axis 45 of the camera 43 reflected by the mirror 42 and the observation portion 100, is defined as B. Since a distance between B and the optical axis 41 of the SEM is L''' and L''' can be regarded as L", the value of "L" can be further reduced.

In this case, the image acquired by the camera 43 is one acquired by obliquely observing the sample 7. However, when an image signal from the camera 43 is subjected to image processing such as trapezoid correction by the control unit 21, the acquired image can be converted into an image as viewed from directly above the sample.

According to the present embodiment, since it is not necessary to provide the camera 43 between a side surface of the lens barrel 2 and the side surface of the housing 8, it is not necessary to provide a camera mounting portion at an upper portion of the housing 8 and the length L can be substantially reduced.

Figure 6:
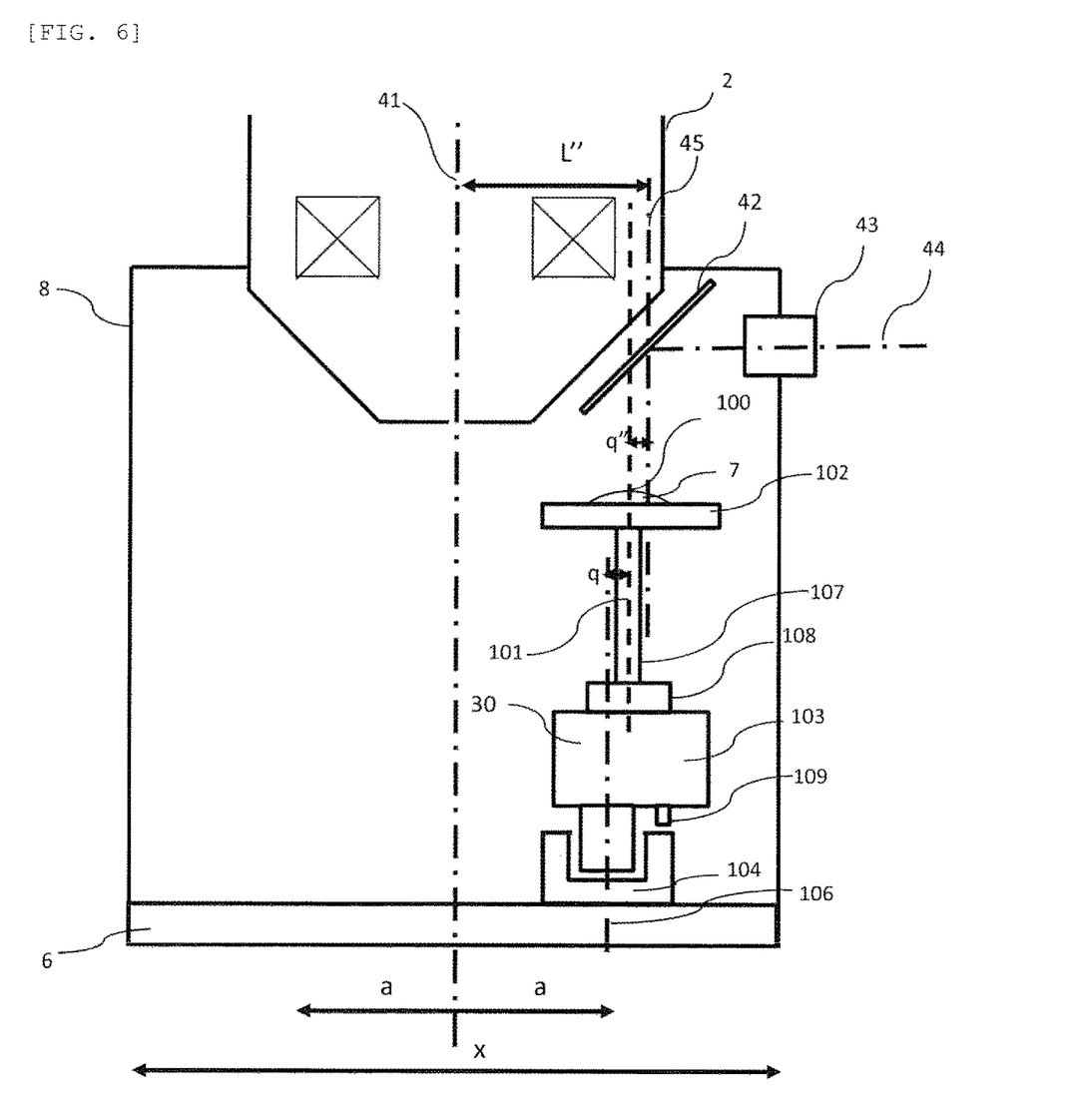
FIG. 6 is a diagram showing an SEM that uses the axis shifting sample table and the mirror.

Next, a method of reducing Δx using an axis shifting sample table and a mirror will be described. FIG. 6 is a diagram showing an SEM that uses an axis shifting sample table and a mirror. Here, when a distance between the virtual central axis 101 of the sample table and the virtual central axis 45 of the imaging unit is defined as a second distance (q"), the second distance is shorter than the first distance (L>q). If the central axis 45 can be aligned with the central axis 101 by shifting the central axis 101 toward the side surface side of the housing 8, the second distance q" is 0.

As described above, the case where it is sufficient with only the axis shifting sample table 30 is shown in the example of FIG. 3, and the case where it is sufficient with only the mirror 42 is shown in the example of FIG. 5. Even in a case where it is not sufficient with only one of the axis shifting sample table 30 and the mirror 42, the observation portion can be placed at the center of an imaging range of the camera 43 if the axis shifting sample table 30 and the mirror 42 are used in combination. Δx is expressed by the following formula (9).

$$\Delta x = (L'' - q - q'') - a \qquad (9)$$

Figure 7:
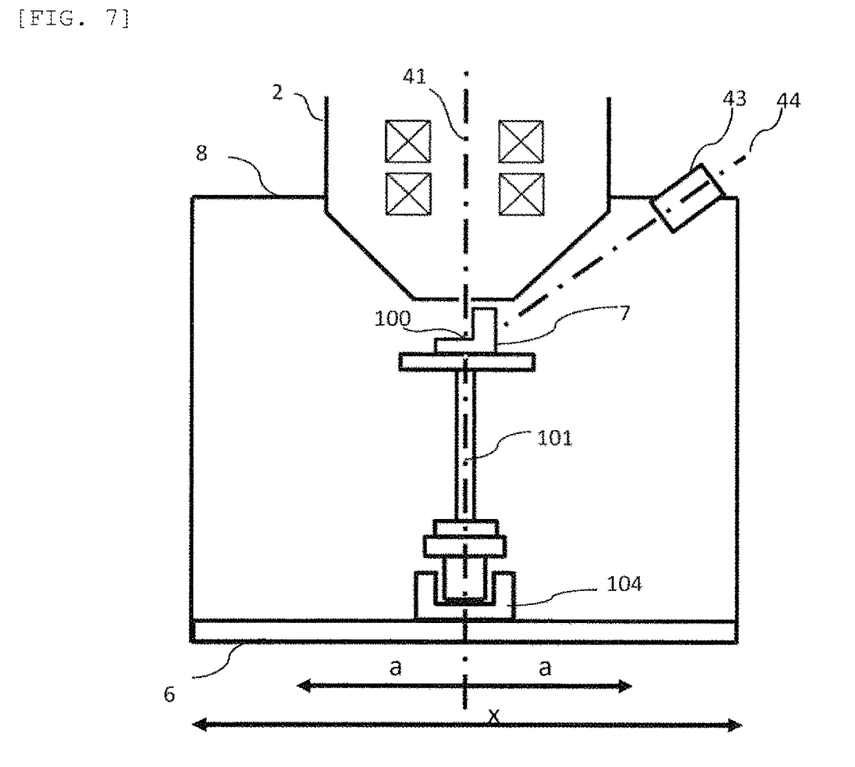
FIG. 7 is a diagram showing an SEM that uses a tilt camera.

FIG. 7 is a diagram showing an SEM that uses a tilt camera. Here, the camera 43 is disposed such that the optical axis 44 does not interfere with the lens barrel 2. Accordingly, the sample 7 can be observed with the camera 43 even when the stage 6 is not moved. Since L is 0 at this time, Δx can be 0 in accordance with formula (3). When the sample 7 is flat, a camera observation image can be converted into an image as viewed from directly above the sample by performing image processing such as trapezoid correction. However, when there is unevenness on the surface of the sample 7, there is a disadvantage that a portion having a small thickness cannot be observed due to a portion having a large sample thickness. Therefore, as a method for correctly observing the entire sample, it is advantageous to have a device configuration including an axis shifting sample table and a mirror shown in FIG. 6.

Figure 8:
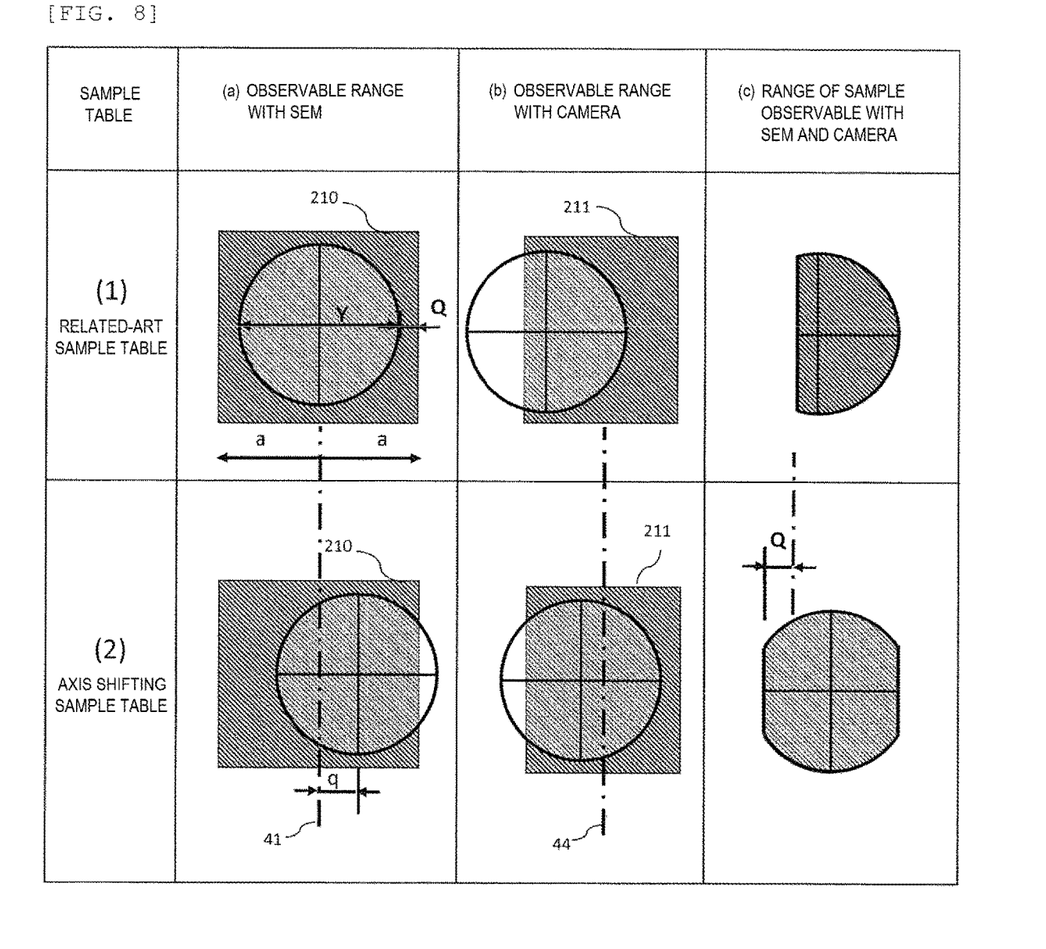
FIG. 8 shows ranges of fields of view.

Hereinafter, the observation range of the sample will be described. FIG. 8 shows ranges of observation fields of view. Circular shapes indicate the sample 7 viewed from above the device, and shaded portions 210 and 211 indicate ranges that can be observed.

(1) In a case of a normal sample table, (a) a center of a range of field of view 210 of the SEM coincides with a center of the sample 7, and the sample 7 of a wide range can be observed. However, (b) only the sample 7 on the camera side can be observed in a range of field of view 211 of the camera, and the field of view of the camera that can be seen in the vicinity of the center of the sample table is small. In addition, (c) the range of the sample that can be observed with the SEM and the camera is small.

On the other hand, (2) in a case of using an axis shifting sample table, since the distance L from the optical axis of the SEM to the optical axis of the camera is reduced by an axis shifting distance q, (a) the center of the sample is shifted by the axis shifting distance q in the optical axis direction of the camera, in the range of field of view 210 of the camera. At this time, (b) similarly, the center of the sample is also shifted in the optical axis direction of the camera, in the range of field of view 211 of the camera. Therefore, (c) an area, which can be observed with the SEM and the camera, can be in the vicinity of the center of the sample. When a size Y of the sample is smaller than a size 2a of the stage 6, a range of field of view Q increased by the axis shifting distance q is expressed by the size a of the stage 6 and the size Y of the sample.

$$Q = (2a - Y) \times \frac{1}{2} \qquad (10)$$

Therefore, when the size Y of the sample is smaller than the size 2a of the stage 6, (b) the range of the field of view of the camera and (c) the range of the sample which can be observed with the SEM and the camera are increased by Q according to formula (8).

When the stage 6 has a rotation function, since the rotation angle of the sample can be controlled in the housing 8, the axis shifting distance q does not have to be present on a plane including the optical axis of the SEM and the optical axis of the camera and present in the optical axis direction of the camera. At this time, the axis shifting distance q is expressed by the following formula (11).

$$q = L \times \frac{1}{2} \qquad (11)$$

When the stage 6 has the above rotation and the axis shifting sample table 30 is used, after the center of the range of field of view 210 of the SEM and the center of the sample coincide with each other, (b) since the position of the sample in the range of field of view 211 of the camera can be moved closer to an optical axis side of the camera than the axis shifting sample table, the range of the sample that can be observed with the SEM and the camera is as large as that of the axis shifting sample of FIG. 8 (2).

In the present embodiment, it is possible to perform camera observation before and after the observation with the SEM, and it is not necessary to perform evacuation or the like before observation with the camera as in PTL 1. Further, the observation with the camera may be performed at the time of evacuating the SEM after the sample is placed in an atmospheric state. Hereinafter, a method of performing camera observation during evacuation will be described with reference to a flowchart of FIG. 9.

Figure 9:
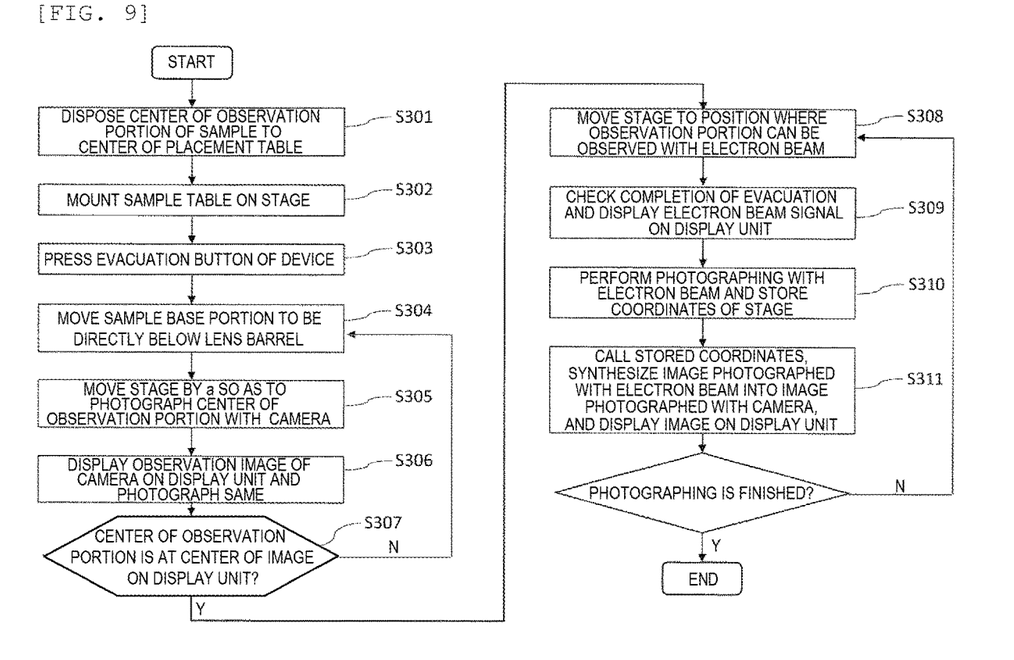
FIG. 9 is a flowchart in a case where the axis shifting sample table is used.

First, the center of the observation portion of the sample 7 is disposed at the center of the disposition table 102 (S301). Next, the sample table is mounted on the stage 6 when the housing is in an atmospheric state (S302). At this time, when the sample table is the axis shifting sample table 30, the direction of the axis shifting sample table is adjusted by a mechanism that fixes the direction, such as a rotation preventing pin. Next, in order to perform evacuation on the SEM, an evacuation button is pressed (S303). In order to effectively utilize this evacuation time, S304 to S308 are performed after S303.

Next, the stage 6 is moved such that the sample base portion 105 is disposed directly below the lens barrel 2 (S304). If the sample table position is recognized in advance, the sample table may be positioned anywhere at this point. For example, if coordinates of the optical axis of the SEM are determined in advance by the control unit 21 and a sensor attached to the stage 6, the stage 6 moves by calling the coordinates.

Next, the stage is moved by a such that the central axis of the observation portion is coaxial with the optical axis of the camera 43 or the optical axis of the camera reflected by the mirror 42 (S305). A value of "a" is input and determined in advance by the control unit.

Next, an observation image of the camera 43 is displayed on the display unit and photographed (S306). Next, it is determined whether a center of the photographed observation portion of the sample is at a center of the image on the display unit, for example, when the position of the sample is to be accurately recognized (S307). As a criterion for the determination, a mark that can be recognized by the camera and that can determine the center of the disposition table 102 is printed or engraved on the sample table; it is checked whether a center of the mark coincides with the center of the camera image displayed on the display unit after performing photographing with the camera 43. The central position may be determined based on the shape of the disposition table 102. The mark may be any shape at this time, such as a circular shape or a quadrangle shape. The number of the mark may be one or two or more as long as the center can be determined. For example, the center may be determined based on four equally distant marks. When it is determined in S307 that the center of the observation portion is not at the center of the image on the display unit, the process returns to step S304.

When it is determined in S307 that the center of the observation portion is at the center of the image on the display unit, the stage is moved to a random position where the observation portion can be observed with the electron beam (S308). When a portion to be observed with the electron beam is specified in advance on the observation image of the camera 43, the stage 6 is moved such that the specified position is disposed directly below the lens barrel.

Next, the evacuation is checked, the sample 7 is observed with the electron beam, and an electron image is displayed on the display unit. Next, photographing is performed with the electron beam, and coordinates of the stage 6 at that time are stored (S310). Next, the stored coordinates of the stage 6 are called, an image photographed with the electron beam is attached to the image photographed with the camera 43, and the obtained image is displayed on the display unit (S311). Then, it is determined whether to continue photographing (S312). When the photographing is to be continued, the process returns to S308 to perform observation with the electron beam. At this time, when the camera observation image and one or more SEM images are displayed on one operation screen and a random SEM image is selected, the coordinate of the stage 6 stored when the selected SEM image is imaged is called, and the stage 6 moves to the position of the coordinate.

In a related-art small-sized SEM such as a desktop SEM, the evacuation of the housing is performed after the optical imaging camera outside the device performs camera photographing, and SEM observation is performed after the stage is moved. However, in the present embodiment, since the camera can be provided in the housing without increasing the size of the housing, the coordinate determination and the stage movement, both for the camera observation and the SEM observation, can be performed in parallel with the evacuation. In addition, there is an effect that the work time of the observation of the same field of view with the camera and the SEM is shortened since Δx can be reduced according to the present embodiment.

REFERENCE SIGN LIST

2: lens barrel, 3: electron source, 4: detector, 5: signal amplifier, 6: stage, 7: sample, 8: housing, 9: vacuum space, 10: pump, 20: display unit, 21: control unit, 30: axis shifting sample table, 40: SEM, 41: optical axis of SEM, 42: mirror, 43: camera, 43': virtual camera, 44: optical axis of camera, 45: optical axis of camera reflected by mirror, 100: observation portion, 101: central axis of observation portion, 102: disposition table, 103: axis shifting portion, 104: base, 105: sample base portion, 106: central axis of base, 107: adjustment screw, 108: nut, 109: rotation preventing pin

The invention claimed is:

1. A charged particle beam device, comprising:
a lens barrel that irradiates a sample with a charged particle beam;
an imaging unit that images an optical image of the sample;
a sample table on which the sample is placed;
a stage that is movable and on which the sample table is placed, wherein
the sample table includes a sample base portion that is arranged below a lower end of the sample table and placed on the stage, and a disposition table arranged above an upper end of the sample table, an observation portion of the sample being located at a center of the disposition table, and
a distance q between a central axis of the sample base portion and a central axis of the disposition table satisfies q≥L−a, L being a distance between an optical axis of the lens barrel and an optical axis of the imaging unit and a being a distance that the stage is moved;
a housing that supports the lens barrel; and
a mirror that is disposed between the lens barrel and the imaging unit, wherein
the imaging unit is disposed on a side surface of the housing and includes an imaging lens with respect to the mirror, and the optical axis of the imaging unit is an optical axis reflected by the mirror.

2. The charged particle beam device according to claim 1, wherein $q=L-a.$

3. The charged particle beam device according to claim 1, further comprising:
a rotation preventing pin that fixes the sample table at an angle.

4. The charged particle beam device according to claim 1, wherein
the stage rotates around a central axis of the sample table that is taken as a rotation axis.

5. The charged particle beam device according to claim 1, wherein the disposition table is connected to the sample table via an adjustment screw.

6. A charged particle beam device, comprising:
a lens barrel that irradiates a sample with a charged particle beam in a height direction of the charged particle beam device;
a housing that supports the lens barrel;
an imaging unit that is disposed on a side surface of the housing and images an optical image of the sample;
a mirror that is disposed between the lens barrel and the imaging unit, wherein
the mirror is disposed in a position where the mirror overlaps with a portion of the lens barrel in length and width directions of the charged particle beam device,
a sample table on which the sample is placed, the sample table including a sample base portion that is arranged below a lower end of the sample table and placed on the stage, and a disposition table arranged above an upper end of the sample table, an observation portion of the sample being located at a center of the disposition table; and
a stage that is movable and on which the sample table is placed, wherein a distance L" between an optical axis of the lens barrel and an optical axis of the imaging unit that is reflected by the mirror satisfies L"≤a, a being a distance that the stage is moved.

7. The charged particle beam device according to claim 6, wherein $L''=a.$

* * * * *